United States Patent [19]

Koyanagi et al.

[11] Patent Number: 5,319,256
[45] Date of Patent: Jun. 7, 1994

[54] SEMICONDUCTOR DEVICE FOR GENERATING CONSTANT POTENTIAL

[75] Inventors: Masaru Koyanagi; Tsuyoshi Etoh, both of Yokohama, Japan

[73] Assignee: Kabushiki Kaisha Toshiba, Kanagawa, Japan

[21] Appl. No.: 875,301

[22] Filed: Apr. 29, 1992

[30] Foreign Application Priority Data

Apr. 30, 1991 [JP] Japan .................... 3-099224

[51] Int. Cl.⁵ .................. H03K 3/01; H03K 3/26
[52] U.S. Cl. .................... 307/296.1; 307/296.2; 307/296.4; 307/296.5; 307/473; 307/270
[58] Field of Search .............. 307/296.1, 296.4–296.5, 307/296.2, 473, 270

[56] References Cited

U.S. PATENT DOCUMENTS 4,691,123 9/1987 Hashimoto et al. ............... 307/296

FOREIGN PATENT DOCUMENTS 0205104 12/1986 European Pat. Off.
0248381 12/1987 European Pat. Off.
0354735 2/1990 European Pat. Off.
59-126326 7/1984 Japan .

Primary Examiner—Margaret R. Wambach
Attorney, Agent, or Firm—Finnegan, Henderson, Farabow, Garrett & Dunner

[57] ABSTRACT

A constant potential generating semiconductor device includes: an output circuit having a first channel type first transistor and a second channel type second transistor serially connected between a first power source and a second power source $V_{ss}$, a connection point between the first and second transistors being connected to an output terminal; a reference potential generating circuit having a first current limiter, a first channel type third transistor, a second channel type fourth transistor, and a second current limiter serially connected between a first power source and a fourth power source, a first connection point interconnecting the first current limiter and the third transistor being connected to the gate of the first transistor, a second connection point interconnecting the fourth transistor and the second current limiter being connected to the gate of the second transistor, the first connection point being connected to the gate of the third transistor, and the gate of the fourth transistor being connected to the second connection point; an output mode switching circuit having a fifth transistor and a sixth transistor, the fifth transistor interconnecting the gate of the first transistor and a fifth power source at a fourth connection point, the sixth transistor interconnecting the gate of the second transistor and a sixth power source at a fifth connection point, the output mode switching circuit having a switching input terminal, a switching signal for switching an output mode being applied to the switching mode input terminal, the switching input terminal being connected to the gates of the fifth and sixth transistors, during a first output mode with a first level signal being applied to the switching input terminal, both the fifth and sixth transistors turning off to maintain the connection between the gates of the first and second transistors and the first and second connection points, respectively, and during a second output mode with a second level signal being applied to the switching input terminal, both the fifth and sixth transistors turning on to electrically disconnect the gates of the first and second transistors from the first and second connection points, respectively; and a potential difference suppressing circuit for suppressing a potential difference between the gate and back gate of the fourth transistor during the second output mode.

32 Claims, 5 Drawing Sheets

SEMICONDUCTOR DEVICE FOR GENERATING CONSTANT POTENTIAL

FIELD OF THE INVENTION

The present invention relates to a constant potential generating semiconductor device to be used for supplying a constant potential to a circuit, for example, supplying a constant potential to a bit line via which data in a memory cell of a memory device is read.

BACKGROUND OF THE INVENTION

FIG. 1 is a circuit diagram showing a conventional constant potential generating semiconductor device. The operation of this circuit will be described briefly. During a first operation mode while a low "L" (ground potential) level signal is supplied to an input terminal V1, a constant potential having an optional intermediate value between two power source potentials $V_{CC}$ and $V_{SS}$, e.g., ($\frac{1}{2}$) $V_{CC}$ is outputted from an output terminal $V_{out}$. During a second operation mode while a high "H" level signal is supplied to the input terminal V1, the output terminal is fixed to the "L" level. During the first operation mode with the output constant potential ($\frac{1}{2}$) $V_{CC}$, if the potential at the output terminal $V_{out}$ shifts from ($\frac{1}{2}$) $V_{CC}$, the potential at the output terminal $V_{out}$ is regulated to ($\frac{1}{2}$) $V_{CC}$ by turning on and off output transistors N14 and P14.

In the circuit shown in FIG. 1, the N-channel (output) transistor N14 and P-channel (output) transistor P14 are connected serially between the power sources $V_{CC}$ and $V_{SS}$ and constitute an output circuit OC. The connection point between these transistors N14 and P14 is connected to the output terminal $V_{out}$.

The gates of the two transistors N14 and P14 are connected via nodes 11 and 13 to two output terminals C2 and C4 of a reference potential output circuit ROC. This circuit ROC automatically controls the potential at the output terminal $V_{out}$ to ($\frac{1}{2}$) $V_{CC}$ during the first operation mode. The circuit ROC is constructed of a P-channel transistor P11, an N-channel transistor N11, a P-channel transistor P12 and an N-channel transistor N12, respectively connected between the power sources $V_{CC}$ and $V_{SS}$. A connection point C2 (output terminal) between the transistors P11 and N11 is connected to the gate of the transistor N11. A connection point C3 between the transistors N11 and P12 is connected via a node 12 to the back gate (substrate) of the transistor P12. The gate of the transistor P12 is connected to a connection point C4 (output terminal) between the transistors P12 and N12. The conductance $g_m$ of the transistors P11 and N12 is set considerably smaller than that of the transistors N11 and P12, to set the potential of the node 11 to ($V_{c3}+V_{thN11}$) and the potential of the node 13 to ($V_{c3}-V_{thP12}$). The output potential $V_{out}$ can be set to an optional value in accordance with the potential $V_{C3}$ at the connection point C3 which is determined by the ratio of the transistors P11 and N12. In the following, the potential $V_{C3}$ is assumed to be set to ($\frac{1}{2}$) $V_{CC}$. During the first operation mode, if the potential at the output terminal $V_{out}$ is ($\frac{1}{2}$) $V_{CC}$, both the output transistors N14 and P14 are turning on. If the potential at the output terminal $V_{out}$ shifts from ($\frac{1}{2}$) $V_{CC}$, one of the output transistors N14 and P14 turns on to regulate the output potential to ($\frac{1}{2}$) $V_{CC}$. In order to prevent both the output transistors N14 and P14 from turning on at the same time, the threshold values $V_{thP12}$ and $V_{thP14}$ of the transistors p12 and P14 are set to satisfy $|V_{thP12}| < |V_{thP14}|$ to provide an output dead band. This is accomplished by connecting the back gate of the transistor P12 to the node 12 which is lower in potential than that of the node 11. It is also possible to broaden the dead band by setting the threshold values $V_{thN11}$ and $V_{thN14}$ of the transistors N11 and N14 to satisfy $V_{thN11} < V_{thN14}$. This is accomplished by making the channel length of the transistor N14 longer than that of the transistor N11. The dead band of an output therefore becomes $V_{thd}$ ($=V_{thdP}+V_{thdN}$) where $V_{thdP} = |V_{thP14}| - |V_{thP12}|$, and $V_{thdN} = V_{thN14} - V_{thN11}$.

Switching between the first and second operation modes is performed by a control circuit CC. An N-channel transistor N13 is connected between the node 11 and power source $V_{SS}$, and a P-channel transistor P13 is connected between the node 13 and power source $V_{CC}$. The switching transistors N13 and P13 are turned on and off at the same time. Namely, they are turned off during the first operation mode, and turned on during the second operation mode. To this end, the transistor N13 is connected via an inverter INV to a NOR gate NOR, and the transistor P13 is directly connected to the NOR gate NOR. One of the input terminals of the NOR gate NOR is connected to the input terminal V1, and the other input terminal is connected to the power source $V_{SS}$. As will be described later, when the low "L" level ($V_{SS}$) is supplied to the input terminal V1, the first operation mode runs, and when the high "H" level ($V_{CC}$) is supplied, the second operation mode runs. In order to fix the output terminal $V_{out}$ to the low "L" level during the second operation mode, an N-channel transistor N15 is connected between the output terminal $V_{out}$ and power source $V_{SS}$, the gate of the transistor N15 being connected to the input terminal V1.

The operation of the circuit shown in FIG. 1 will be described below.

When the input terminal V1 is set to the $V_{SS}$ level, the first operation mode starts. Specifically, the transistor N15 as well as the control transistors N13 and P13 turn off to disconnect the nodes 11 and 13 from the power sources $V_{CC}$ and $V_{SS}$. The potentials of the nodes 11 and 13 in this condition are determined by an output from the reference potential output circuit ROC. More specifically, as described previously, the potential of the node 11 is set to [($\frac{1}{2}$) $V_{CC}+V_{thN11}$], and the potential of the node 13 is set to [($\frac{1}{2}$) $V_{CC}+V_{thdP}$]. As a result, if the potential of the output terminal $V_{out}$ is within the dead band between [($\frac{1}{2}$) $V_{CC}+V_{thdP}$] and [($\frac{1}{2}$) $V_{CC}+V_{thN11}$], both the output transistors N14 and P14 turn off. If the potential of the output terminal $V_{out}$ shifts beyond the dead band, one of the transistors N14 and P14 turns on to regulate the output potential within the dead band.

When the input terminal V1 is set to the $V_{CC}$ level, the second operation mode starts. Specifically, both the control transistors N13 and P13 turn on. Therefore, the node 11 takes the $V_{SS}$ level to turn off the transistor N14, and the node 13 takes the $V_{CC}$ level to turn off the transistor P14. As a result, the output terminal $V_{out}$ will not be influenced by the nodes 11 and 13. Since the transistor N15 has been turned on, the output terminal $V_{out}$ is fixed to the $V_{SS}$ level.

FIG. 2 is a circuit diagram of another conventional constant level generating semiconductor device In the circuit shown in FIG. 2, the bias potential of the back gate of the transistor P12 is supplied from the node 11 in order to narrow the dead band at the output terminal $V_{out}$. The different points of the circuit shown in FIG. 2 from the circuit shown in FIG. 1 are as follows. A P-channel transistor P25 is additionally provided. An output of the inverter INV is connected to the gate of the P-channel transistor P25, the source of the transistor P25 being connected to the node 11, and the drain thereof being connected via a node 26 to the back gate of the P-channel transistor P12. With such a circuit arrangement, the bias potential level (potential level of the node 26) of the P-channel transistor P12 is raised to the potential level of the node 11. The potential of the node 11 is higher than that of the node 12 by a threshold value of the N-channel transistor N11. By raising the potential of the node 26, the threshold value of the P-channel transistor P12 rises and a difference of threshold values between the P-channel transistors P14 and P12 becomes small. In this manner, the dead band at the output terminal $V_{out}$ becomes narrower than the circuit shown in FIG. 1.

In the circuits shown in FIGS. 1 and 2, the nodes 15 and 11 are fixed to the ground level and the nodes 13 and 14 are fixed to the power source potential level, during the second operation mode. In this state, the bias node 12 of the P-channel transistor P12 enters a floating state because the N-channel transistor N11 and P-channel transistor P12 (P25) become non-conductive. The cross section of the transistor P12 is shown in FIG. 3. During the second operation mode, an N well 1 serving as the bias layer for the node 12 (26) enters a floating state, while a P+drain D serving as the node 13 is supplied with the power source potential via the P-channel transistor P13. Assuming that the potential of the node 12 (26) is lower than that of the node 13, electric charges of the power source from the P-channel transistor P13 are injected into a P type layer 3 via the node 13 [P+layer (drain D)]and node 12 (26) [N well]. Electric charges from the power source are always injected into the P type layer 3, increasing the standby current.

The P type layer 3 is set to a negative potential by a biasing circuit in most cases. However, if the amount of electric charges via the N well 1 becomes in excess of the biasing ability of the biasing circuit, an ordinary bias potential will not be supplied to the P type layer 3, resulting in operation errors of other devices formed within the P type layer 3.

SUMMARY OF THE INVENTION

The present invention has been made in consideration of the above circumstances. It is an object of the present invention to provide a constant potential generating semiconductor device capable of preventing an increase of a standby current.

Reference potentials from a reference potential generating circuit are not supplied to an output circuit if a certain level signal is applied to an input terminal. In this state, a second operation mode starts during which an output terminal is disconnected from the output circuit. During the second operation mode, a potential difference between the drain and back gate of a transistor in the reference potential generating circuit is controlled by a potential difference suppressing circuit. As a result, electric charges are prevented from flowing from the drain node of the transistor into the back gate (semiconductor substrate) node.

According to the present invention, it is therefore possible to suppress an increase of a standby current and prevent operation errors of other devices in a constant potential generating semiconductor device.

DESCRIPTION OF THE PREFERRED EMBODIMENTS

Embodiments of the present invention will be described with reference to the accompanying drawings.

Figure 1:
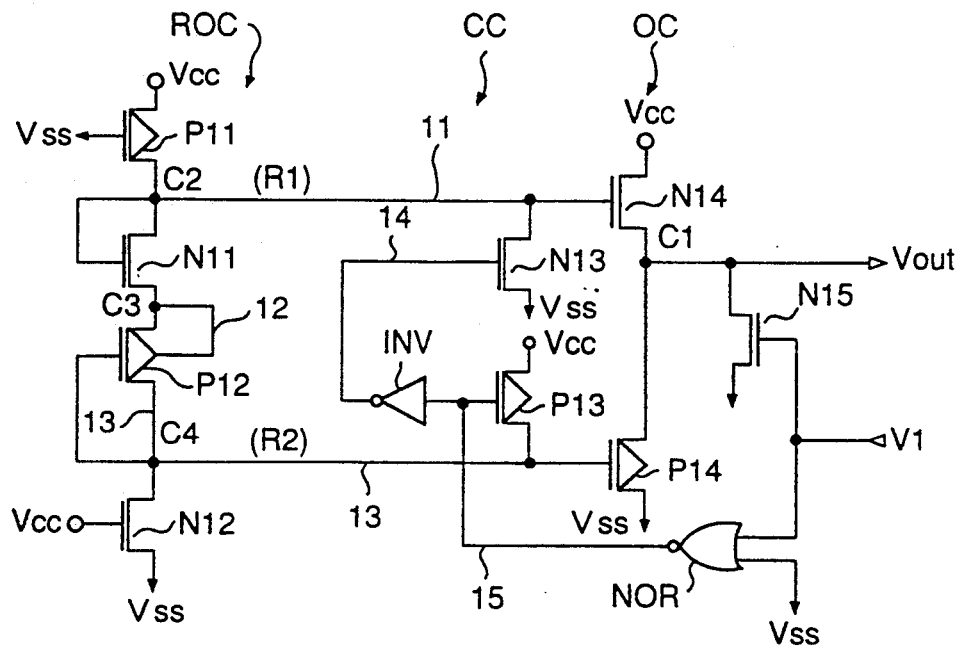
FIG. 1 is a circuit diagram showing an example of a conventional semiconductor device.
Figure 4:
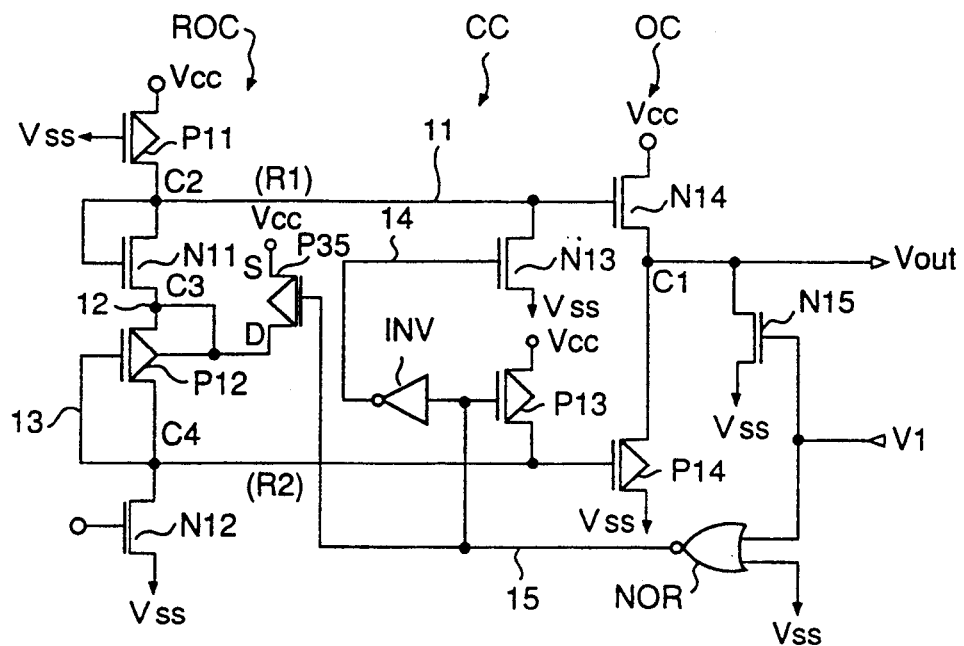
FIG. 4 is a circuit diagram of a semiconductor device according to a first embodiment of the present invention.

FIG. 4 is a circuit diagram showing the first embodiment of the semiconductor device according to the present invention. In the circuit shown in FIG. 4, during the second operation mode like that described with FIG. 1, the back gate (semiconductor substrate) of the transistor P12 is set to $V_{CC}$ level to make small a potential difference between the back gate (node 12) and drain (node 13), thereby preventing electric charges from flowing from the node 13 into the node 12.

Figure 3:
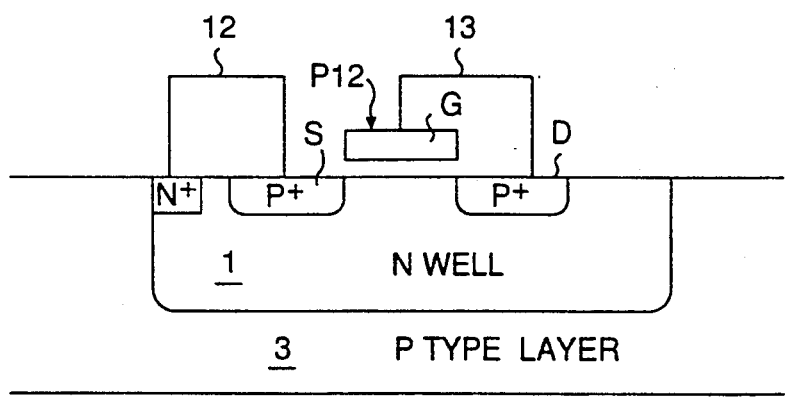
FIG. 3 is a cross section of a P-channel transistor.

In FIG. 4, a P-channel transistor P35 has its drain connected to the bias point or node 12 of the P-channel transistor P12, its source connected to a power source, and its gate connected to the node 15. The other circuit structure is the same as FIG. 1. The cross section of the P-channel transistor P12 is shown in FIG. 3.

The operation of the circuit shown in FIG. 4 will be described.

During the second operation mode with the potential at the input terminal V1 being set to the power source potential $V_{CC}$, the potentials at the nodes 15 and 11 are fixed to the ground level $V_{SS}$ and the potentials at the nodes 13 and 14 are fixed to the power source potential $V_{CC}$. Furthermore, the potential at the node 12, which has conventionally been of a floating state, is raised to the power source potential $V_{CC}$ by the P-channel transistor P35. Specifically, the gate of the P-channel transistor P35 is connected to the gate of the P-channel transistor P13 and an output terminal of the NOR gate NOR. Therefore, the potential at the node 12 is set to the higher power source potential level same as the node 13. As seen from FIG. 3, the potential of the N well 1 of the P-channel transistor P12 connected to the node 12 will not become lower than the potential of the node 13. Electric charges will not therefore flow from the node 13 and N well 1 into the P type layer 3. In this manner, an increase of a standby current and operation errors of other devices, as conventional, can be prevented.

Figure 2:
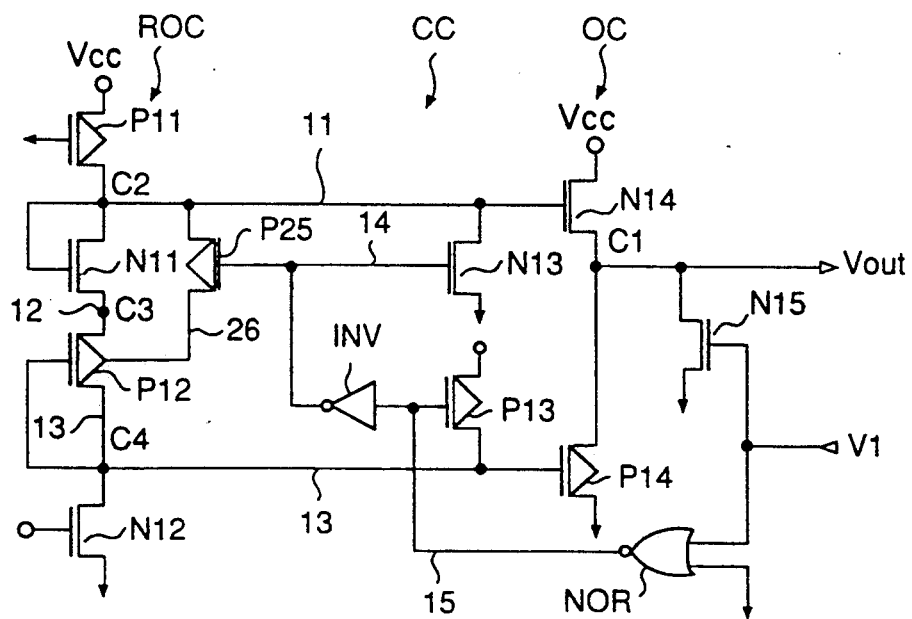
FIG. 2 is a circuit diagram showing another example of a conventional semiconductor device.
Figure 5:
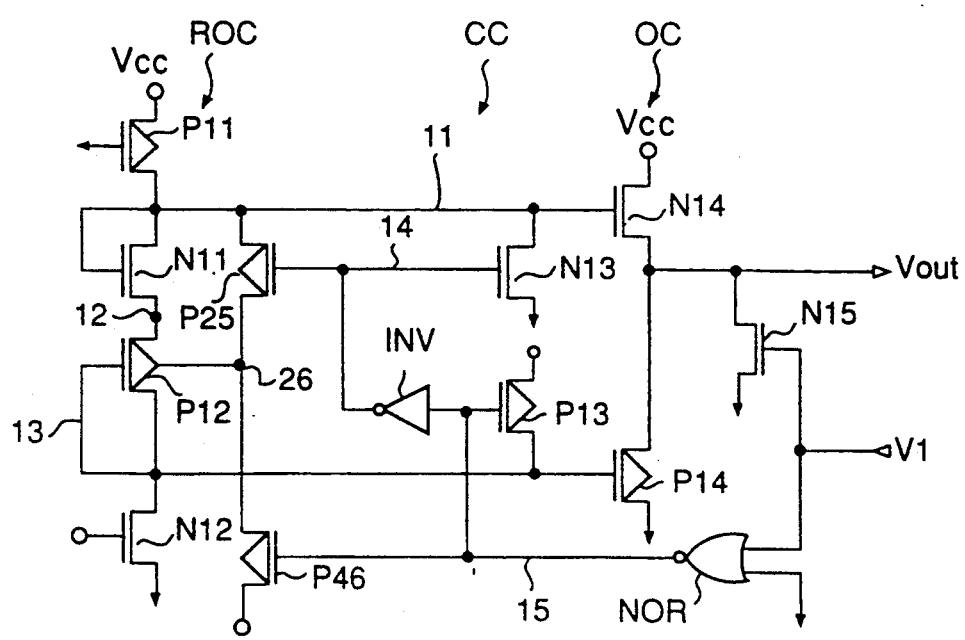
FIG. 5 is a circuit diagram of a semiconductor device according to a second embodiment of the present invention.

FIG. 5 is a circuit diagram showing another embodiment of the semiconductor device according to the present invention. The operation principle of the circuit shown in FIG. 5 is the same as that of the circuit shown in FIG. 4. Referring to FIG. 5, a P-channel transistor P46 has its drain connected to the node 26 or bias point of the P-channel transistor P12, its source connected to the power source, and its gate connected to a node 26. The other circuit structure is the same as FIG. 2.

During the second operation mode with the potential at the input terminal V1 raised to the power source potential, the potentials at the nodes 15 and 11 are fixed to the ground level and the potentials at the nodes 13 and 14 are fixed to the power source potential. Furthermore, with the provision of the P-channel transistor P46, the potential at the N well 1 of the P-channel transistor P12 connected to the node 12 will not become lower than the potential at the drain (node 13). As a result, electric charges will not be injected from the drain (node 13) and N well 1 into the P type layer 3. In this manner, an increase of a standby current and operation errors of other devices, as conventional, can be prevented.

Figure 6:
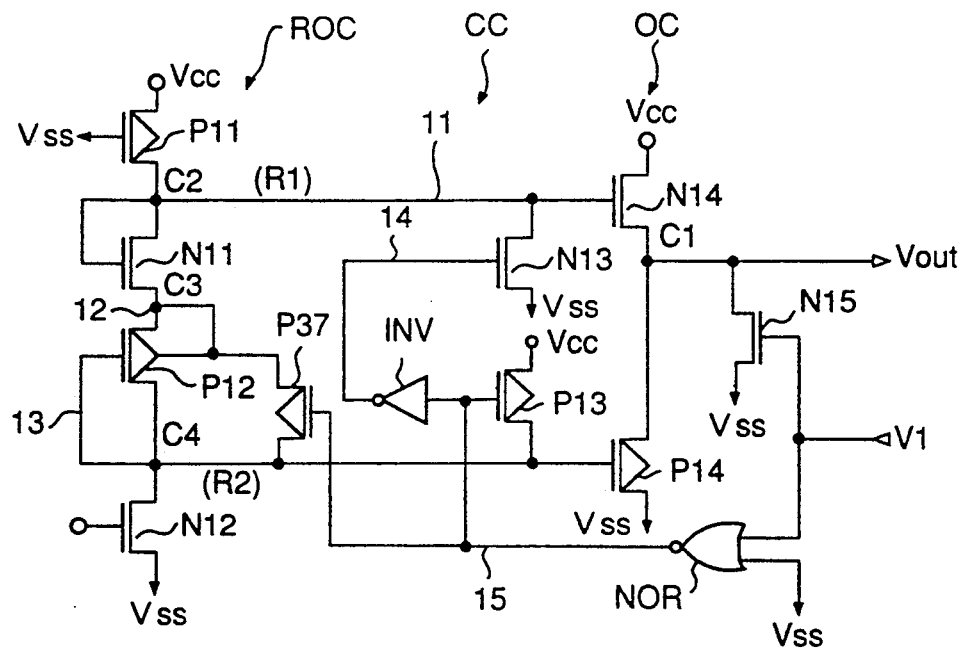
FIG. 6 is a circuit diagram of a semiconductor device according to a third embodiment of the present invention.
Figure 7:
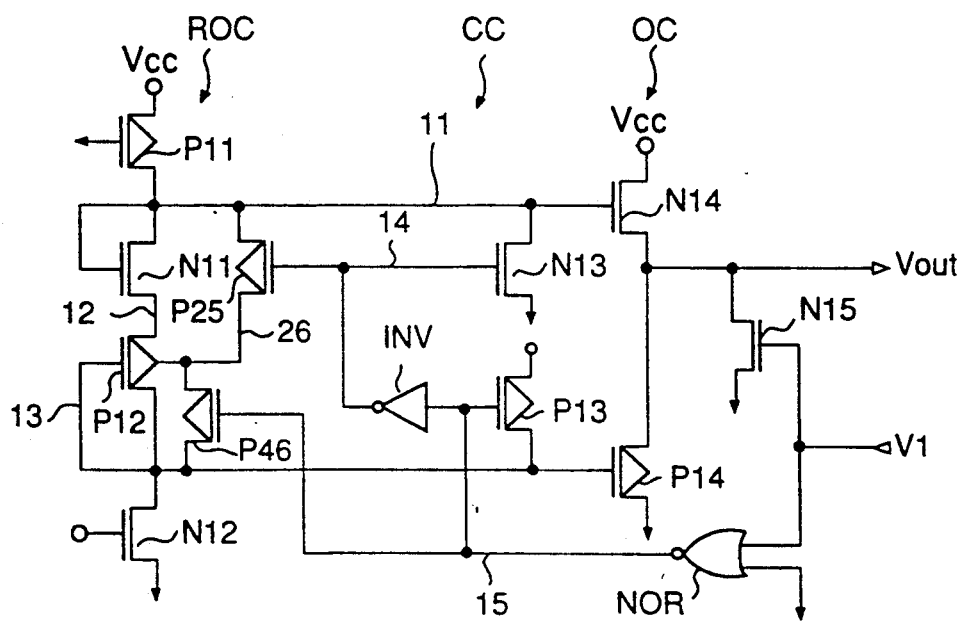
FIG. 7 is a circuit diagram of a semiconductor device according to a fourth embodiment of the present invention.

The source nodes of the transistors P35 and P46 shown in FIGS. 4 and 5 may be connected to the node 13 as shown in FIGS. 6 and 7, with similar advantageous effects described above.

Figure 8:
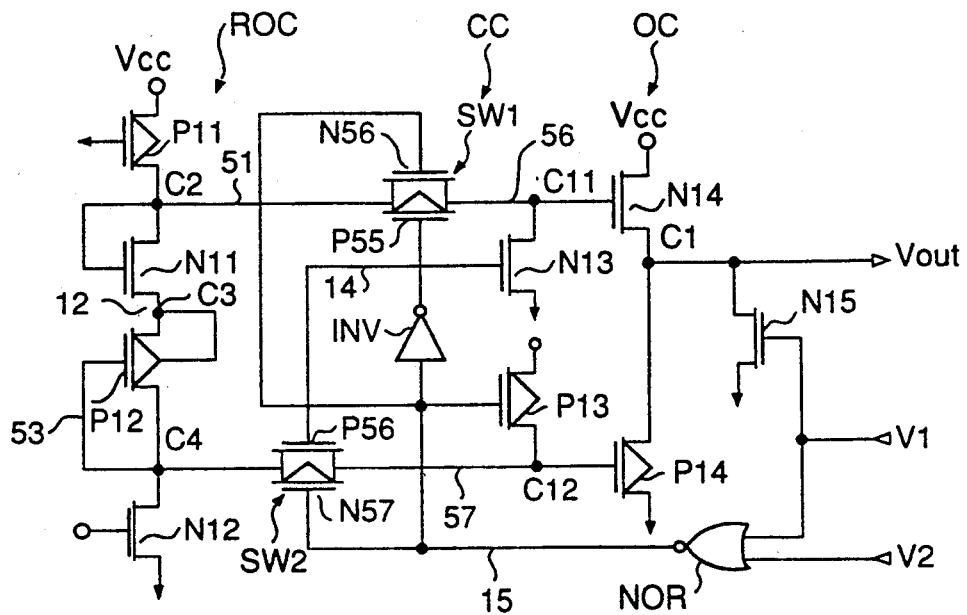
FIG. 8 is a circuit diagram of a semiconductor device according to a fifth embodiment of the present invention.

FIG. 8 is a circuit diagram showing another embodiment of the present invention. In the circuit shown in FIG. 8, a potential difference between the back gate (node 12) and drain (node 53) of the transistor P12 is eliminated by preventing a level change to be caused by the turn-on of the control transistors N13 and P13 from transmitting to connection points C2 and C4 of the reference potential generating circuit ROC, during the second operation mode.

As seen from FIG. 8, a MOS switch SW$_1$ constructed of an N-channel transistor N56 and a P-channel transistor P55 is connected between a node 56 and node 51, the node 56 being connected to the gate of the N-channel transistor N14 and the node 51 being connected to the connection point between the P-channel transistor P11 and N-channel transistor N11. Another MOS switch SW$_2$ constructed of a P-channel transistor P56 and an N-channel transistor N57 is connected between a node 57 and node 53, the node 57 being connected to the gate of the P-channel transistor P14 and the node 53 being connected to the connection point between the P-channel transistor P12 and N-channel transistor N12. One input terminal of the NOR gate NOR is connected to the input terminal V1, and the other input terminal of the NOR gate NOR is connected to an input terminal V2. The other circuit structure is the same as the circuit shown in FIG. 1.

During the second operation mode with the potential at the input terminal V1 being raised to the power source potential V$_{CC}$, the potential of the node 57 rises to the power source potential via the P-channel transistor P13. However, since the MOS switch SW$_2$ connected between the nodes 53 and 57 is being closed, the potential of the node 53 will not rise. In this case, the potential of the node 14 is the power source potential. As a result, the N-channel transistor N13 becomes conductive, and the node 56 is fixed to the ground potential. However, since the MOS switch SW$_1$ connected between the nodes 51 and 56 is being closed, the node 51 will not take the ground potential. As a result, the potential at the N well 1 of the P-channel transistor P12 connected to the node 12 will not become lower than the potential at the drain D (node 53). Thus, electric charges will not be injected from the node 53 (drain D) and N well 1 into the P type layer 3. In this manner, an increase of a standby current and operation errors of other devices, as conventional, can be prevented.

Figure 9:
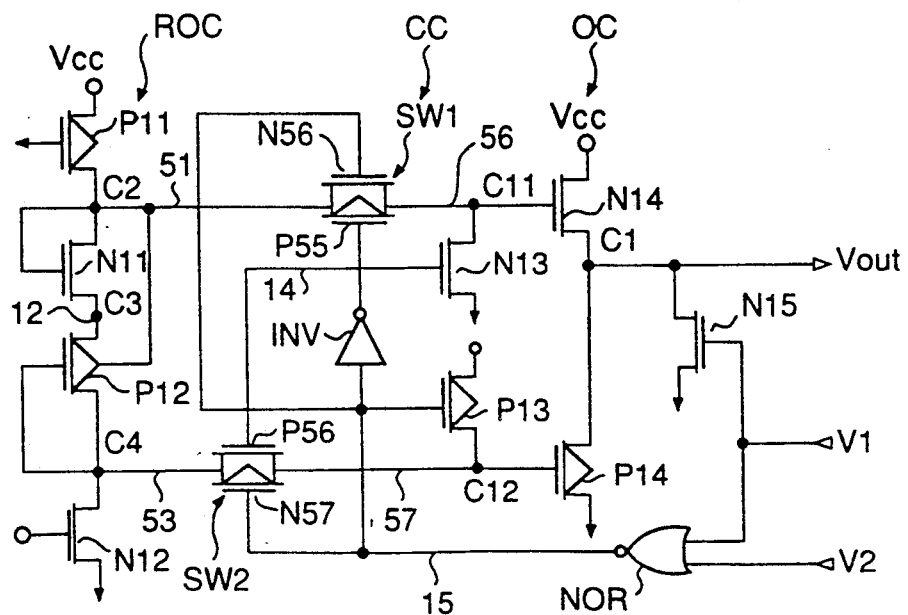
FIG. 9 is a circuit diagram of a semiconductor device according to a sixth embodiment of the present invention.

FIG. 9 is a circuit diagram showing another embodiment of the present invention. The operation principle of the circuit shown in FIG. 9 is the same as that of the circuit shown in FIG. 8.

As seen from FIG. 9, the bias of the P-channel transistor P12 is not supplied from the node 12, but from the node 51. The other circuit structure is the same as that shown in FIG. 8.

During the second operation mode with the potential at the input terminal V1 being raised to the power source potential, the potential of the node 57 rises to the power source potential via the P-channel transistor P13. However, since the MOS switch SW$_2$ connected between the nodes 53 and 57 is being closed, the potential of the node 53 will not rise. In this case, the potential of the node 14 is the power source potential. As a result, the N-channel transistor N13 becomes conductive, and the node 56 is fixed to the ground potential. However, since the MOS switch SW$_1$ connected between the nodes 51 and 56 is being closed, the node 51 will not take the ground potential. As a result, the potential at the N well 1 of the P-channel transistor P12 connected to the node 12 will not become lower than the potential at the drain D (node 53). Thus, electric charges will not be injected from the node 53 and N well 1 into the P type layer 3.

In this manner, an increase of a standby current and operation errors of other devices, as conventional, can be prevented.

The circuits shown in FIGS. 8 and 9 have the input terminals V1 and V2. When the input terminal V2 is set to the V$_{CC}$ level, the circuit enters the second operation mode irrespective of the level at the input terminal V1. In this case, the output terminal V$_{out}$ enters a floating state.

Instead of the transistors P11 and N12 of the reference potential output circuit ROC shown in FIGS. 4 to 9, other current limiting means such as resistive elements may be used.

What is claimed is:

1. A constant potential generating semiconductor device, comprising:
    an output circuit having a first channel type first transistor and a second channel type second transistor serially connected between a first power source and a second power source, a first connection point between said first and second transistors being connected to an output terminal;
    a reference potential generating circuit having a first current limiting means, a first channel type third transistor, a second channel type fourth transistor, and a second current limiting means serially connected between a third power source and a fourth power source, a second connection point interconnecting said first current limiting means and said third transistor being connected to a gate of said first transistor, a third connection point interconnecting said fourth transistor and said second current limiting means being connected to a gate of said second transistor, said second connection point being connected to a gate of said third transistor, and a gate of said fourth transistor being connected to said third connection point;

an output mode switching circuit having a fifth transistor and a sixth transistor, said fifth transistor interconnecting the gate of said first transistor and a fifth power source at a fourth connecting point, said sixth transistor interconnecting the gate of said second transistor and a sixth power source at a fifth connection point, said output mode switching circuit having a switching input terminal, a switching signal for switching an output mode being applied to said switching input terminal, said switching input terminal being connected to gates of said fifth and sixth transistors, during a first output mode with a first level signal being applied to said switching input terminal, both said fifth and sixth transistors turning off to maintain a potential on the gate of said first transistor at a potential substantially the same as a potential at said second connection point and maintain a potential on the gate of said second transistor at a potential substantially the same as a potential at said third connection point, and during a second output mode with a second level signal being applied to said switching input terminal, both said fifth and sixth transistors turning on to fix the potentials of the gates of the first and second transistors at the potentials of the fifth and sixth power sources; and a potential difference suppressing circuit for suppressing a potential difference between the gate and a back gate of said fourth transistor during said second output mode.

2. A device according to claim 1, wherein the back gate of said fourth transistor being connected to a sixth connection point interconnecting said third transistor and said fourth transistor.

3. A device according to claim 2, wherein the back gate of said fourth transistor is connected via a seventh transistor to said third power source, and a gate of said seventh transistor is connected to said switching input terminal, to turn on said seventh transistor during said second output mode.

4. A device according to claim 2, wherein the back gate of said fourth transistor is connected via a seventh transistor to said third connection point, and a gate of said seventh transistor is connected to said switching input terminal, to turn on said seventh transistor during said second output mode.

5. A device according to claim 2, wherein a first switching means is connected between said second and fourth connection points, a second switching means is connected between said third and fifth connection points, and said first and second switching means having control terminals which are connected to said switching input terminal to turn on both said first and second switching means during said first output mode and turn off both said first and second switching means during said second output mode.

6. A device according to claim 1, wherein the back gate of said fourth transistor is connected via a seventh transistor to said first connection point, and a gate of said seventh transistor is connected to said switching input terminal, to turn on said seventh transistor during said first output mode and turn off said seventh transistor during said second output mode.

7. A device according to claim 6, wherein the back gate of said fourth transistor is connected via an eighth transistor to a seventh power source, and a gate of said eighth transistor is connected to said switching input terminal, to turn off/on said eighth transistor during said first/second output mode.

8. A device according to claim 6, wherein the back gate of said fourth transistor is connected via an eighth transistor to said third connection point, and a gate of said eighth transistor is connected to said switching input terminal, to turn off/on said eighth transistor during said first/second output mode.

9. A device according to claim 1, wherein the back gate of said fourth transistor is connected to said second connection point.

10. A device according to claim 9, wherein first switching means is connected between said second and fourth connection points, second switching means is connected between said third and fifth connection points and said first and second switching means having control terminals which are connected to said switching input terminal to turn on both said first and second switching means during said first output mode and turn off both said first and second switching means during said second output mode.

11. A device according to claim 1, wherein said output terminal is connected via a potential fixing transistor to a seventh power source, and a gate of said potential fixing transistor is connected to said switching input terminal, to turn off/on said potential fixing transistor during said first/second output mode.

12. A device according to claim 3, wherein said output terminal is connected via a potential fixing transistor to a seventh power source, and a gate of said potential fixing transistor is connected to said switching input terminal, to turn off/on said potential fixing transistor during said first/second output mode.

13. A device according to claim 4, wherein said output terminal is connected via a potential fixing transistor to a seventh power source, and a gate of said potential fixing transistor is connected to said switching input terminal, to turn off/on said potential fixing transistor during said first/second output mode.

14. A device according to claim 5, wherein said output terminal is connected via a potential fixing transistor to a seventh power source, and a gate of said potential fixing transistor is connected to said switching input terminal, to turn off/on said potential fixing transistor during said first/second output mode.

15. A device according to claim 7, wherein said output terminal is connected via a potential fixing transistor to a eighth power source, and a gate of said potential fixing transistor is connected to said switching input terminal, to turn off/on said potential fixing transistor during said first/second output mode.

16. A device according to claim 8, wherein said output terminal is connected via a potential fixing transistor to a seventh power source, and a gate of said potential fixing transistor is connected to said switching input terminal, to turn off/on said potential fixing transistor during said first/second output mode.

17. A device according to claim 10, wherein said output terminal is connected via a potential fixing transistor to a seventh power source, and a gate of said potential fixing transistor is connected to said switching input terminal, to turn off/on said potential fixing transistor during said first/second output mode.

18. A device according to claim 1, wherein said first and second current limiting means includes transistors.

19. A device according to claim 3, wherein said first and second current limiting means includes transistors.

20. A device according to claim 4, wherein said first and second current limiting means includes transistors.

21. A device according to claim 5, wherein said first and second current limiting means includes transistors.

22. A device according to claim 7, wherein said first and second current limiting means includes transistors.

23. A device according to claim 8, wherein said first and second current limiting means includes transistors.

24. A device according to claim 10, wherein said first and second current limiting means includes transistors.

25. A device according to claim 1, wherein said first-/second channel types are N/P channel types, said first, third and sixth power sources are higher potential side power sources, and said second, fourth and fifth power sources are lower potential side power sources.

26. A device according to claim 1, wherein said output mode switching circuit further includes a circuit for forcibly setting said output mode to said second output mode.

27. A device according to claim 3, wherein said output mode switching circuit further includes a circuit for forcibly setting said output mode to said second output mode.

28. A device according to claim 4, wherein said output mode switching circuit further includes a circuit for forcibly setting said output mode to said second output mode.

29. A device according to claim 5, wherein said output mode switching circuit further includes a circuit for forcibly setting said output mode to said second output mode.

30. A device according to claim 7, wherein said output mode switching circuit further includes a circuit for forcibly setting said output mode to said second output mode.

31. A device according to claim 8, wherein said output mode switching circuit further includes a circuit for forcibly setting said output mode to said second output mode.

32. A device according to claim 10, wherein said output mode switching circuit further includes a circuit for forcibly setting said output mode to said second output mode.

* * * * *